United States Patent
Kang et al.

(10) Patent No.: US 9,839,126 B2
(45) Date of Patent: Dec. 5, 2017

(54) PRINTED CIRCUIT BOARD AND METHOD OF MANUFACTURING THE SAME

(71) Applicant: Samsung Electro-Mechanics Co., Ltd., Suwon-Si (KR)

(72) Inventors: Myung Sam Kang, Suwon-Si (KR); Young Kwan Lee, Suwon-Si (KR); Seung Eun Lee, Suwon-Si (KR); Seung Yeop Kook, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/824,598

(22) Filed: Aug. 12, 2015

(65) Prior Publication Data

US 2016/0050755 A1    Feb. 18, 2016

(30) Foreign Application Priority Data

Aug. 14, 2014    (KR) .................. 10-2014-0105903

(51) Int. Cl.
*H05K 1/09*    (2006.01)
*H05K 1/11*    (2006.01)
*H05K 3/42*    (2006.01)
*H05K 3/40*    (2006.01)

(52) U.S. Cl.
CPC ............. *H05K 1/115* (2013.01); *H05K 3/403* (2013.01); *H05K 3/421* (2013.01); *H05K 3/429* (2013.01); *H05K 1/117* (2013.01); *H05K 2203/072* (2013.01)

(58) Field of Classification Search
CPC .. H05K 1/02; H05K 1/16; H05K 1/18; H05K 3/00; H05K 3/38; H05K 3/42; H05K 3/46; H05K 3/48; H01L 21/66; H01L 23/00; H01L 23/48; H01L 23/58
USPC ................ 174/251, 254, 255, 260–262, 266; 361/766; 257/532, 693, 707, 741, 768, 257/770

See application file for complete search history.

(56) References Cited

U.S. PATENT DOCUMENTS

| | | | | |
|---|---|---|---|---|
| 4,543,715 A | * | 10/1985 | Iadarola | H05K 3/403 174/261 |
| 5,406,034 A | * | 4/1995 | Frei | H05K 1/115 174/262 |
| 6,039,889 A | * | 3/2000 | Zhang | H05K 3/0038 216/13 |
| 6,137,064 A | * | 10/2000 | Kiani | H05K 1/0222 174/261 |
| 6,388,208 B1 | * | 5/2002 | Kiani | H05K 1/0222 174/260 |
| 6,534,723 B1 | * | 3/2003 | Asai | H01L 23/49811 174/255 |
| 6,751,101 B2 | * | 6/2004 | Sakai | H01F 27/292 174/250 |
| 6,891,272 B1 | * | 5/2005 | Fjelstad | H01L 23/49827 257/736 |

(Continued)

*Primary Examiner* — Xiaoliang Chen
(74) *Attorney, Agent, or Firm* — NSIP Law

(57) ABSTRACT

There are provided a printed circuit board including: an insulation layer in which a via hole is formed; vias formed in the via hole; first circuit patterns formed below the insulation layer and electrically connected to the vias; and second circuit patterns formed on the insulation layer to be bonded to the vias; wherein the via has a diameter smaller than that of the via hole, and a method of manufacturing a printed circuit board.

6 Claims, 18 Drawing Sheets

(56) References Cited

U.S. PATENT DOCUMENTS

| | | |
|---|---|---|
| 7,485,411 B2 | 2/2009 | Jung et al. |
| 8,918,991 B2 * | 12/2014 | Ao .................. H05K 1/0251 174/261 |
| 2001/0038145 A1 * | 11/2001 | Mashino ........... H01L 23/49822 257/707 |
| 2001/0052425 A1 * | 12/2001 | Andoh ................. H05K 3/4069 174/262 |
| 2002/0023778 A1 * | 2/2002 | Watanabe .............. H05K 3/421 174/262 |
| 2002/0135058 A1 * | 9/2002 | Asahi ................. H01L 23/5389 257/687 |
| 2002/0185311 A1 * | 12/2002 | Cohn .................... H05K 3/242 174/262 |
| 2003/0164244 A1 * | 9/2003 | Miyazawa ............. H01P 1/047 174/520 |
| 2003/0219956 A1 * | 11/2003 | Mori ..................... H05K 1/162 438/393 |
| 2003/0221969 A1 * | 12/2003 | Tomisaka ................ C25D 3/38 205/298 |
| 2004/0078970 A1 * | 4/2004 | Naitoh .................. H05K 3/423 29/852 |
| 2004/0251047 A1 * | 12/2004 | Bartley .................. H05K 1/115 174/262 |
| 2005/0282314 A1 * | 12/2005 | Lo .......................... H05K 3/242 438/117 |
| 2006/0054352 A1 * | 3/2006 | Ryu ....................... H05K 1/185 174/260 |
| 2006/0213685 A1 * | 9/2006 | Wang .................. H05K 3/0052 174/258 |
| 2008/0302468 A1 * | 12/2008 | Sidhu ..................... H05K 1/116 156/150 |
| 2008/0308314 A1 * | 12/2008 | Sasaki ............... H01L 23/49816 174/263 |
| 2009/0294951 A1 * | 12/2009 | Murai ..................... H01L 24/19 257/693 |
| 2012/0298993 A1 * | 11/2012 | Nagata .................. H01L 23/481 257/48 |
| 2013/0111745 A1 * | 5/2013 | Ao ....................... H05K 1/0251 29/837 |
| 2013/0112470 A1 * | 5/2013 | Ao ......................... H05K 1/115 174/266 |
| 2014/0345911 A1 * | 11/2014 | Lee ...................... H05K 3/4691 174/251 |
| 2015/0206826 A1 * | 7/2015 | Nagata .................. H01L 23/481 257/770 |

* cited by examiner

PRINTED CIRCUIT BOARD AND METHOD OF MANUFACTURING THE SAME

CROSS-REFERENCE TO RELATED APPLICATION

This application claims the benefit of Korean Patent Application No. 10-2014-0105903, filed on Aug. 14, 2014, entitled "Printed Circuit Board and Method of Manufacturing The Same" which is hereby incorporated by reference in its entirety into this application.

BACKGROUND

The present disclosure relates to a printed circuit board and a method of manufacturing the same.

In general, a printed circuit board is formed by forming wirings on one surface or both surfaces of a board made of various thermosetting synthetic resins using a copper wire, fixedly disposing integrated circuits (ICs) or electronic components on the board, implementing electrical wirings between the ICs or the electronic components, and then coating the electrical wirings using an insulator. In accordance with the recent development of electronic industry, the demand for multi-functional and slim and lightweight electronic components has rapidly increased. Therefore, a printed circuit board on which the electronic components are mounted has also been demanded to have high density wirings and a thin thickness. In addition, as the recent trend toward slimness and lightweight of electronic products is accelerated, production of a printed circuit board manufactured by applying a build-up scheme of connecting only required circuit layers to each other to implement at least bond between circuit layers instead of applying a plated through hole processing scheme implemented in a multilayer printed circuit board is increased. Vias formed in the printed circuit board to which the build-up scheme is applied may include a staggered type via, an O-ring type via, and a stack type via.

RELATED ART DOCUMENT

Patent Document (Patent Document 1) U.S. Pat. No. 7,485,411

SUMMARY

An aspect of the present disclosure may provide a printed circuit board capable of forming a circuit having high density, and a method of manufacturing the same.

According to an aspect of the present disclosure, a printed circuit board may include: an insulation layer in which a via hole is formed; vias formed in the via hole; first circuit patterns formed below the insulation layer and electrically connected to the vias; and second circuit patterns formed on the insulation layer to be bonded to the vias; wherein the via has a diameter smaller than that of the via hole.

The second circuit patterns may have a diameter smaller than that of the via hole.

The first circuit patterns may have a diameter smaller than that of the via hole.

A plurality of vias may be spaced apart from each other in the via hole.

According to another aspect of the present disclosure, a method of manufacturing a printed circuit board may include: forming a second insulation layer on the first insulation layer in which a via land is formed; forming a via hole exposing the via land in the second insulation layer; forming a plating resist in which an opening part is patterned above the second insulation layer, the opening part exposing a portion of the via hole and a region in which circuit patterns are to be formed; and forming vias in the via hole and forming circuit patterns on the second insulation layer by performing plating on the opening part of the plating resist.

In the forming of the plating resist, the plating resist may be patterned so that the opening part has a diameter smaller than that of the via hole.

According to another aspect of the present disclosure, a method of manufacturing a printed circuit board may include: forming a via hole in an insulation layer; forming plating resists in which opening parts are patterned above and below the insulation layer, the opening parts exposing a portion of the via hole and a region in which circuit patterns are to be formed; and forming vias in the via hole and forming circuit patterns on and beneath the insulation layer by performing plating on the opening parts of the plating resists.

In the forming of the plating resists, the plating resists may be patterned so that the opening part has a diameter smaller than that of the via hole.

BRIEF DESCRIPTION OF DRAWINGS

The above and other aspects, features and other advantages of the present disclosure will be more clearly understood from the following detailed description taken in conjunction with the accompanying drawings, in which.

DESCRIPTION OF EMBODIMENT

Figure 1:
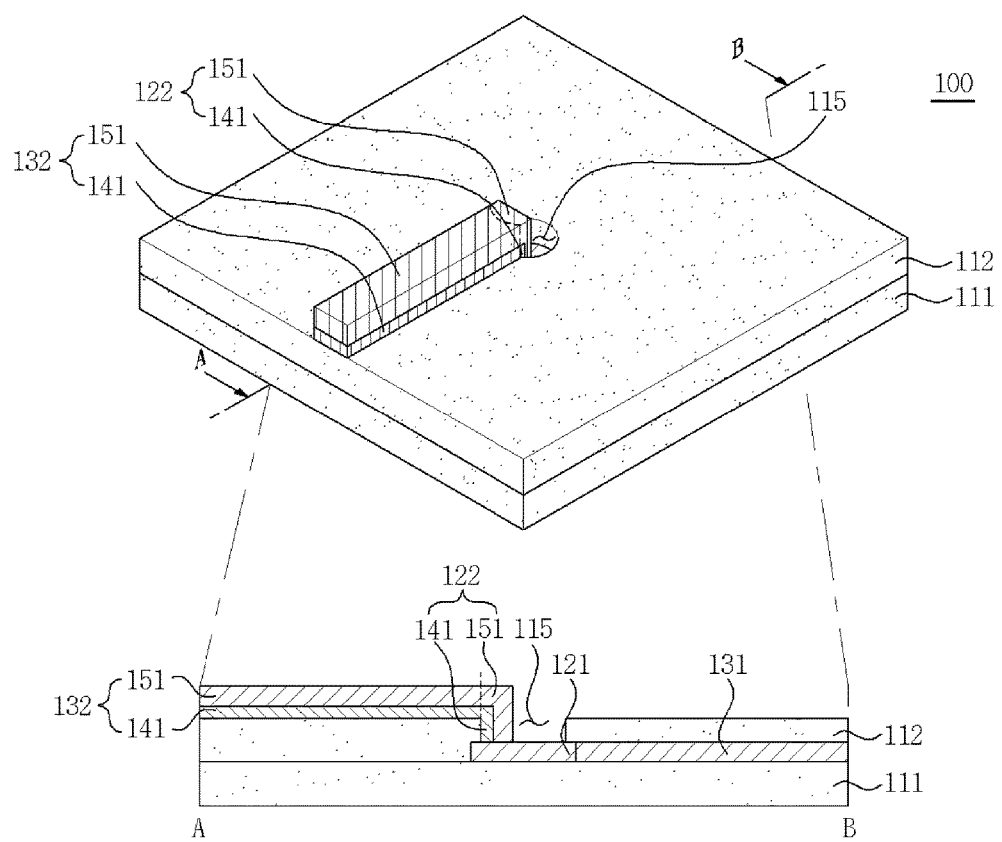
FIG. 1 is an exemplified view illustrating a printed circuit board according to a first exemplary embodiment of the present disclosure.

The objects, features and advantages of the present disclosure will be more clearly understood from the following detailed description of the exemplary embodiments taken in conjunction with the accompanying drawings. Throughout the accompanying drawings, the same reference numerals are used to designate the same or similar components, and redundant descriptions thereof are omitted. Further, in the following description, the terms "first," "second," "one side," "the other side" and the like are used to differentiate a certain component from other components, but the configuration of such components should not be construed to be limited by the terms. Further, in the description of the present disclosure, when it is determined that the detailed description of the related art would obscure the gist of the present disclosure, the description thereof will be omitted.

Hereinafter, exemplary embodiments of the present disclosure will be described in detail with reference to the accompanying drawings.

FIG. 1 is an exemplified view illustrating a printed circuit board according to a first exemplary embodiment of the present disclosure.

Referring to FIG. 1, the printed circuit board 100 according to the first exemplary embodiment of the present disclosure includes insulation layers, a via land 121, vias 122, first circuit patterns 131 and second circuit patterns 132.

The insulation layers according to an exemplary embodiment of the present disclosure are divided into a first insulation layer 111 and a second insulation layer 112.

According to the exemplary embodiment of the present disclosure, the first insulation layer 111 and the second insulation layer 112 are made of a complex polymer resin which is generally used as an interlayer insulation material. For example, the first insulating layer 111 and the second insulation layer 112 may be made of a prepreg, or an epoxy based resin such as Ajinomoto Build up Film (ABF), FR-4, Bismaleimide Triazine (BT) or the like.

According to the exemplary embodiment of the present disclosure, the via hole 115 is formed in the second insulation layer 112. The via hole 115 according to the exemplary embodiment of the present disclosure is formed so as to penetrate through the second insulation layer 112.

Although not shown in FIG. 1, one or more layers of circuit patterns and vias may be further formed in the first insulation layer 111.

According to the exemplary embodiment of the present disclosure, the via land 121 is formed on the first insulation layer 111. In addition, the via land 121 is positioned below the via hole 115. According to the exemplary embodiment of the present disclosure, the via land 121 is made of a conductive material used in a circuit board field. For example, the via land 121 is made of copper.

As shown in FIG. 1, the via land 121 is bonded to the first circuit patterns 131. According to the exemplary embodiment of the present disclosure, the first circuit patterns 131 are formed on the first insulation layer 111. In addition, the first circuit patterns 131 are bonded to a side surface of the via land 121 and electrically connected to each other. The first circuit patterns 131 according to the exemplary embodiment of the present disclosure are made of a conductive metal which is used in a circuit board field. For example, the first circuit patterns 131 are made of copper. Even though the first circuit patterns 131 bonded to the via land 121 are described by way of example according to the exemplary embodiment of the present disclosure, a structure of the printed circuit board 100 of the present disclosure is not limited thereto. That is, the first circuit patterns 131 bonded to the via land 121 are not necessarily formed. Whether or not the first circuit patterns 131 are formed, positions at which the first circuit patterns 131 are to be formed, and structures of the first circuit patterns may be selected and changed according to choice of a person skilled in the art.

According to the exemplary embodiment of the present disclosure, the via 122 is formed in the via hole 115 formed in the second insulation layer 2.

According to the exemplary embodiment of the present disclosure, the via 122 has a diameter smaller than that of the via hole 115. In addition, one side surface of the via 122 contacts the second insulation layer 112, and the other side surface thereof does not contact the second insulation layer 112.

The via 122 formed as described above penetrates through the second insulation layer 112, a lower surface of the via is bonded to the via land 122 and an upper surface of the via is bonded to the second circuit patterns 132. Therefore, the via land 122 and the second circuit patterns 132 are electrically connected to each other by the via 122.

According to the exemplary embodiment of the present disclosure, the via 122 is made of a conductive material used in a circuit board field. For example, the via 122 is made of copper.

According to the exemplary embodiment of the present disclosure, the second circuit patterns 132 are formed on the second insulation layer 112. In addition, one end of the second circuit patterns 132 is bonded to the via 122. The second circuit patterns 132 as described above have a diameter smaller than that of the via hole 115.

As shown in FIG. 1, the second circuit patterns 132 have the same diameter as the via 122. However, the structure is provided by way of example, and the structure of the printed circuit board 100 according to the present disclosure is not limited thereto. That is, the second circuit patterns 132 and the via 122 may have a different diameter.

According to the exemplary embodiment of the present disclosure, the second circuit patterns 132 are made of a conductive material which is used in a circuit board field. For example, the second circuit patterns 132 are made of copper.

In the printed circuit board 100 according to the exemplary embodiment of the present disclosure, the via 122 and the second circuit patterns 132 have a diameter smaller than that of the via hole 115. Therefore, even in a case in which there are a plurality of second circuit patterns 132 and vias 122 in the printed circuit board 100 according to the exemplary embodiment of the present disclosure, the second circuit patterns 132 may have high density.

FIGS. 2 through 10 are exemplified views illustrating a method of manufacturing a printed circuit board according to the first exemplary embodiment of the present disclosure.

Figure 2:
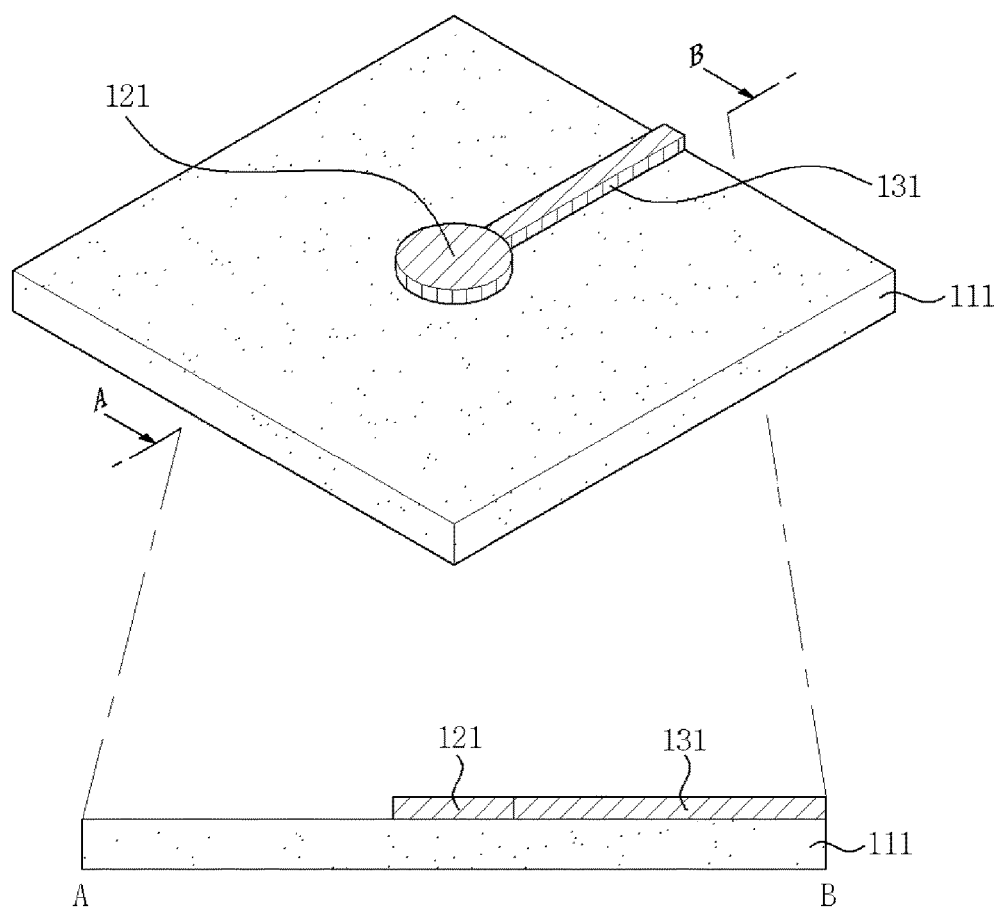
FIGS. 2 through 10 are exemplified views illustrating a method of manufacturing a printed circuit board according to the first exemplary embodiment of the present disclosure.

Referring to FIG. 2, first, the via land 121 is formed in the first insulation layer 111.

According to the exemplary embodiment of the present disclosure, the first insulation layer 111 is made of a complex polymer resin which is generally used as an interlayer insulation material. For example, the first insulating layer 111 may be made of a prepreg, or an epoxy based resin such as Ajinomoto Build up Film (ABF), FR-4, Bismaleimide Triazine (BT) or the like. In addition, although not shown in FIG. 2, one or more layers of circuit patterns and vias may be further formed in the first insulation layer 111.

According to the exemplary embodiment of the present disclosure, the via land 121 is formed on the first insulation layer 111. The via land 121 according to the exemplary embodiment of the present disclosure may be formed by any method of forming the via land used in a circuit board field. In addition, the via land 121 is made of a conductive material used in a circuit board field. For example, the via land 121 is made of copper.

According to the embodiment of the present disclosure, the first circuit patterns 131 may be formed on the first insulation layer 111. As shown in FIG. 2, the first circuit patterns 131 are bonded to a side surface of the via land 121 and electrically connected to each other. The first circuit patterns 131 may be formed by any method of forming the circuit patterns used in a circuit board field. In addition, the first circuit patterns 131 are made of a conductive material used in a circuit board field. For example, the first circuit patterns 131 are made of copper.

Although all of the via land 121 and the first circuit patterns 131 are formed on the first insulation layer 111 by way of example in the exemplary embodiment of the present disclosure, the present disclosure is not limited thereto. That is, the first circuit patterns 131 are possible to be omitted according to choice of a person skilled in the art. In addition, although the via land 121 bonded to the first circuit patterns 131 is shown in the exemplary embodiment of the present disclosure, the via land 121 and the first circuit patterns 131 may be separated from each other according to choice of a person skilled in the art.

Figure 3:
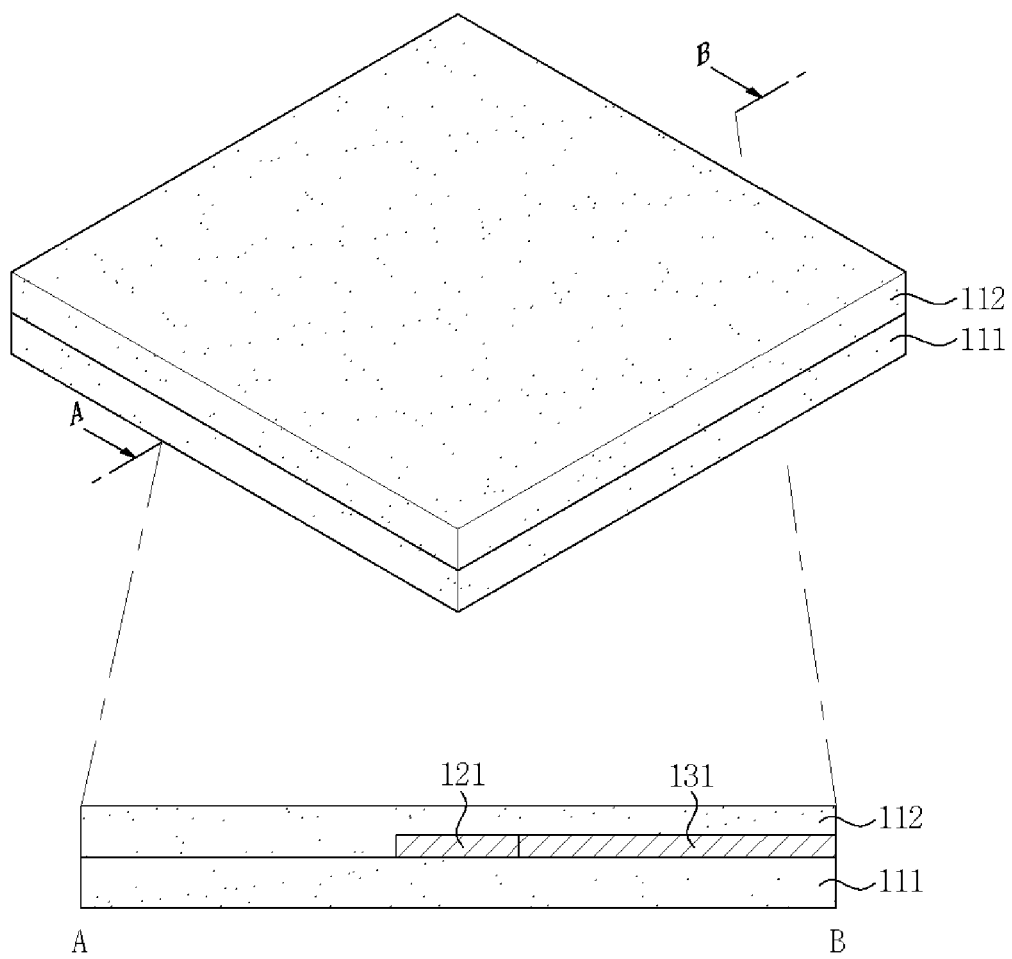

Referring to FIG. 3, the second insulation layer 112 is formed.

According to the exemplary embodiment of the present disclosure, the second insulation layer 112 is formed on the first insulation layer 111.

According to the exemplary embodiment of the present disclosure, the second insulation layer 112 is made of a complex polymer resin which is generally used as an interlayer insulation material. For example, the second insulating layer 112 may be made of a prepreg, or an epoxy based resin such as Ajinomoto Build up Film (ABF), FR-4, Bismaleimide Triazine (BT) or the like.

The second insulation layer 112 according to the exemplary embodiment of the present disclosure may be formed on the first insulation layer 111, as a film form, by stacking and pressurizing methods. Otherwise, the second insulation layer 112 may be formed on the first insulation layer 111 by applying a liquid phase material forming the second insulation layer 112. The second insulation layer 112 as described above may be formed by any method known in a circuit board field.

The second insulation layer 112 as described above is formed so as to bury the via land 121 and the first circuit patterns 131.

Figure 4:
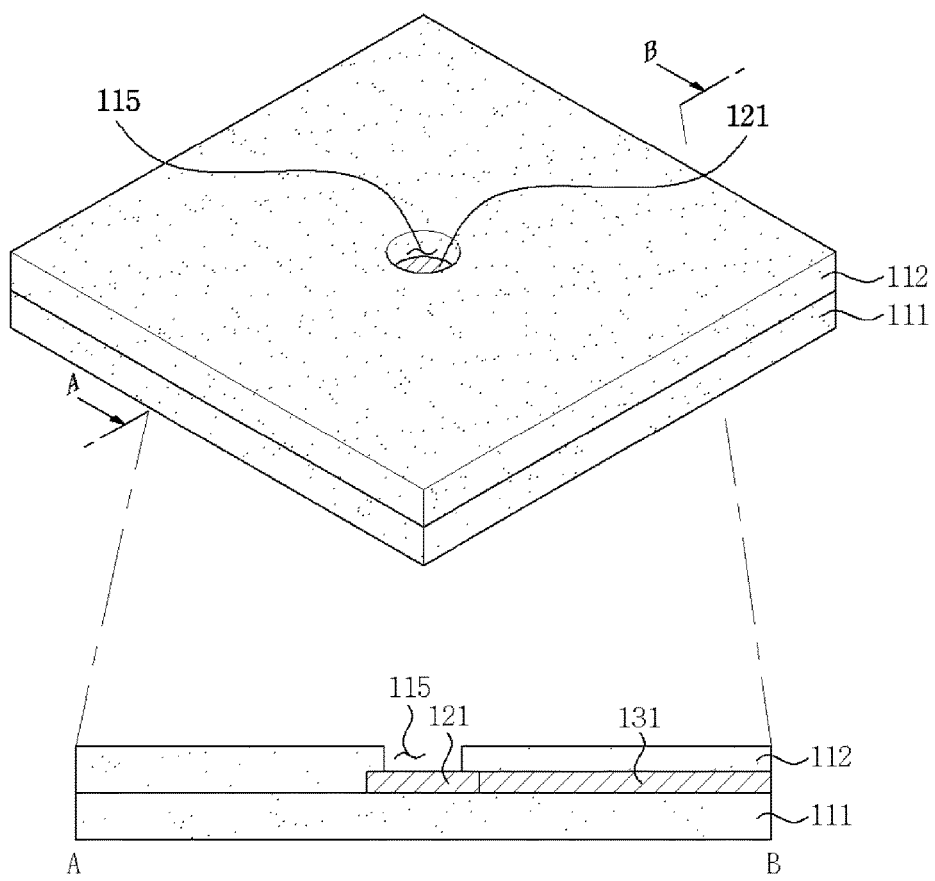

Referring to FIG. 4, the via hole 115 is formed.

According to the exemplary embodiment of the present disclosure, the via hole 115 penetrating through the second insulation layer 112 is formed. According to the exemplary embodiment of the present disclosure, the via hole 115 is formed by any known method of forming the via hole in a circuit board field. The via hole 115 as formed above is formed above the via land 121. Therefore, the via land 121 is exposed to the outside by the via hole 115.

Figure 5:
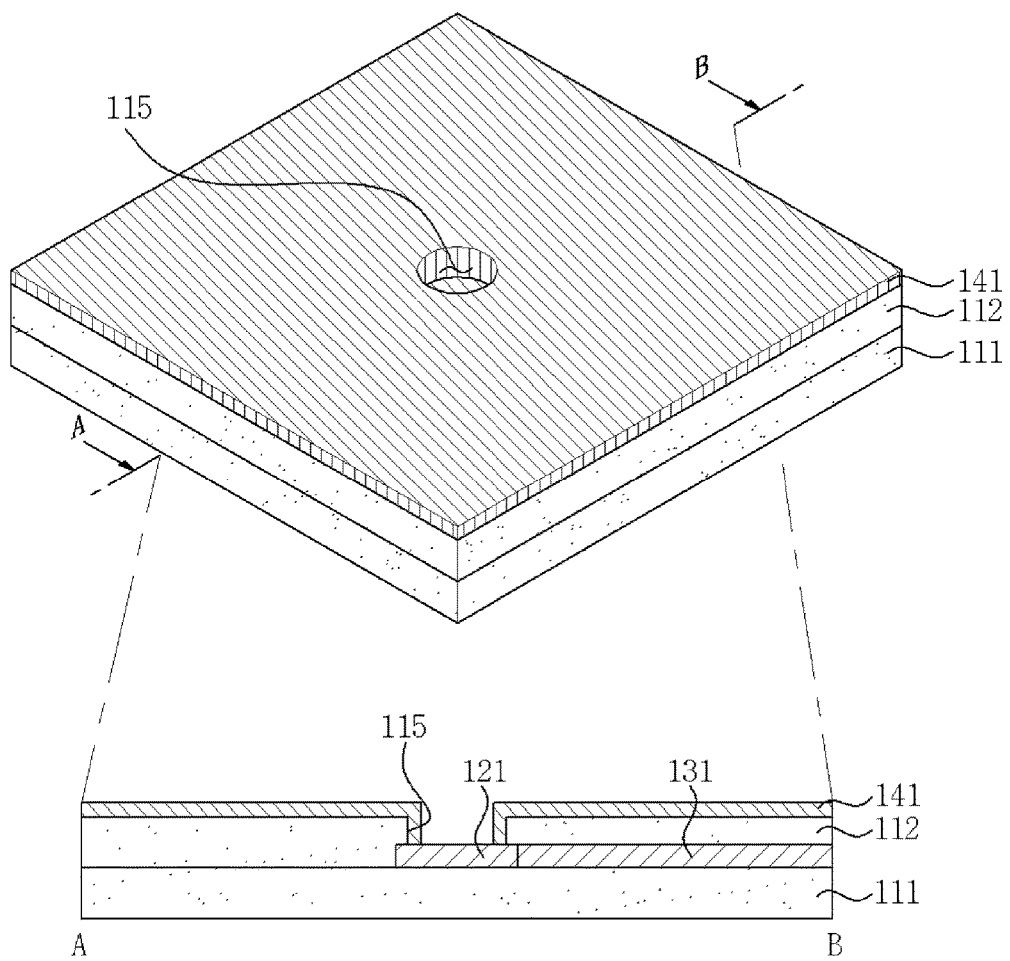

Referring to FIG. 5, a seed layer 141 is formed.

According to the exemplary embodiment of the present disclosure, the seed layer 141 is formed on the second insulation layer 2. In addition, since the seed layer 141 is formed along a surface of the second insulation layer 112, the seed layer 141 is formed in the via hole 115 and on the via land 121.

According to the exemplary embodiment of the present disclosure, the seed layer 141 is formed by an electroless plating method. The seed layer 141 according to the exemplary embodiment of the present disclosure is made of a conductive material used in a circuit board field. For example, the seed layer 141 is made of copper.

Figure 6:
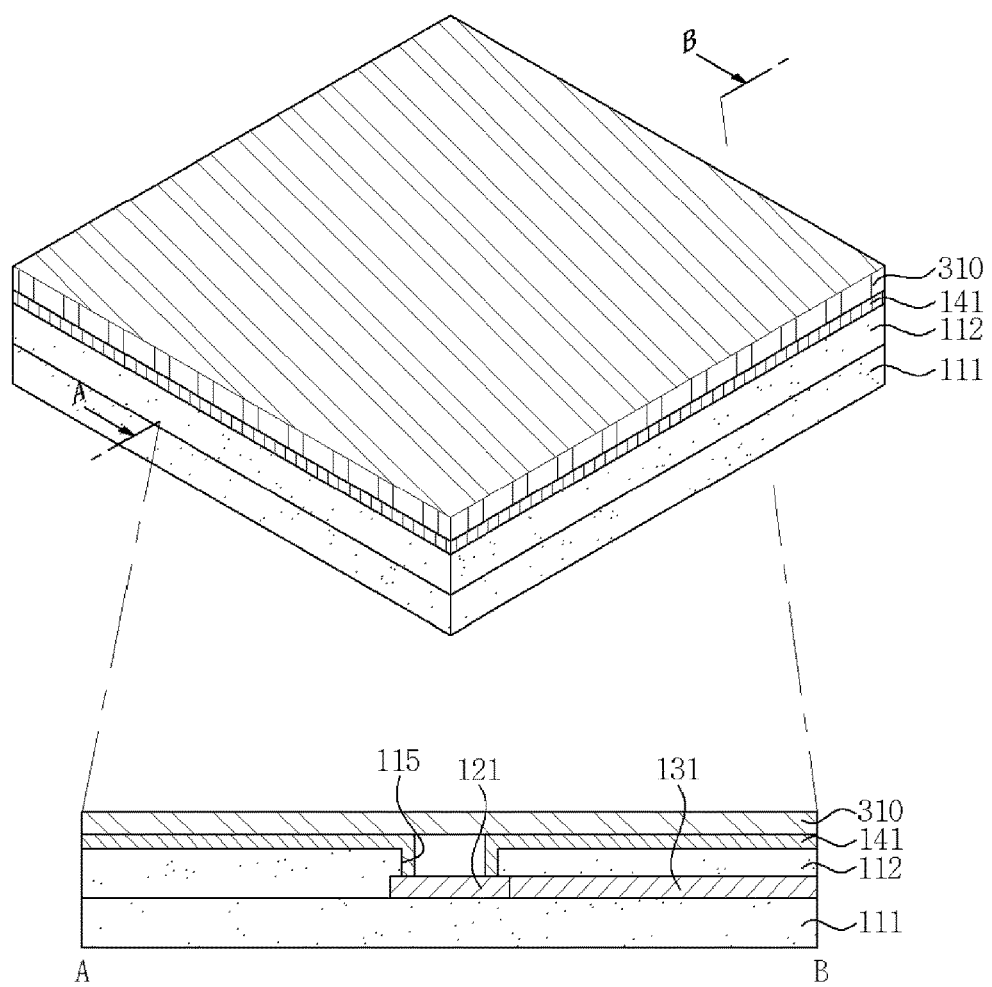

Referring to FIG. 6, a plating resist 310 is formed.

According to the exemplary embodiment of the present disclosure, the plating resist 310 is formed on the seed layer 141. The plating resist 310 according to the exemplary embodiment of the present disclosure is made of a photosensitive material.

Figure 7:
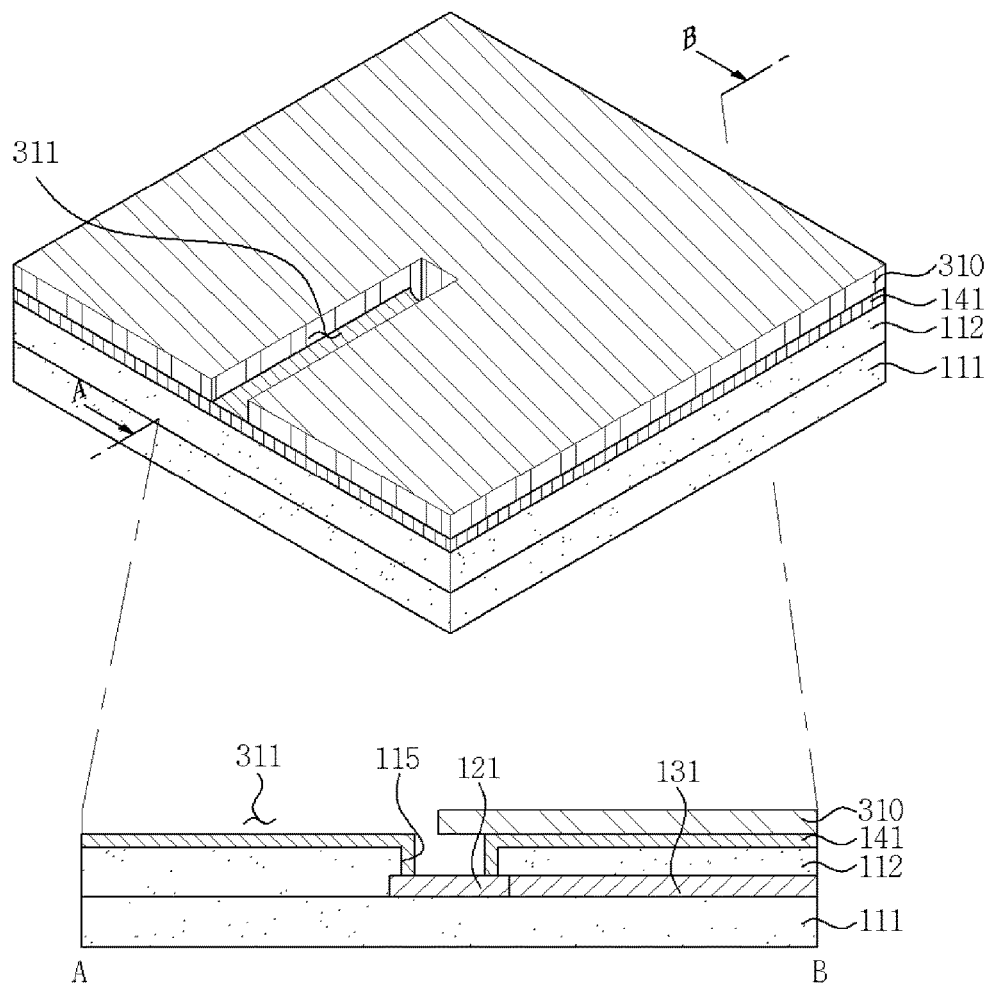

Referring to FIG. 7, patterning is performed on the plating resist 310.

According to the exemplary embodiment of the present disclosure, an opening part 311 is formed by performing exposure and development processes on the plating resist 310. According to the exemplary embodiment of the present disclosure, the opening part 311 is formed so as to expose regions in which circuit patterns (not shown) and the vias (not shown) are to be formed later to the outside. That is, the opening part 311 of the plating resist 310 is formed so as to continuously expose a portion of the via hole 115 and a portion of the seed layer 141 formed on the second insulation layer 112.

Figure 8:
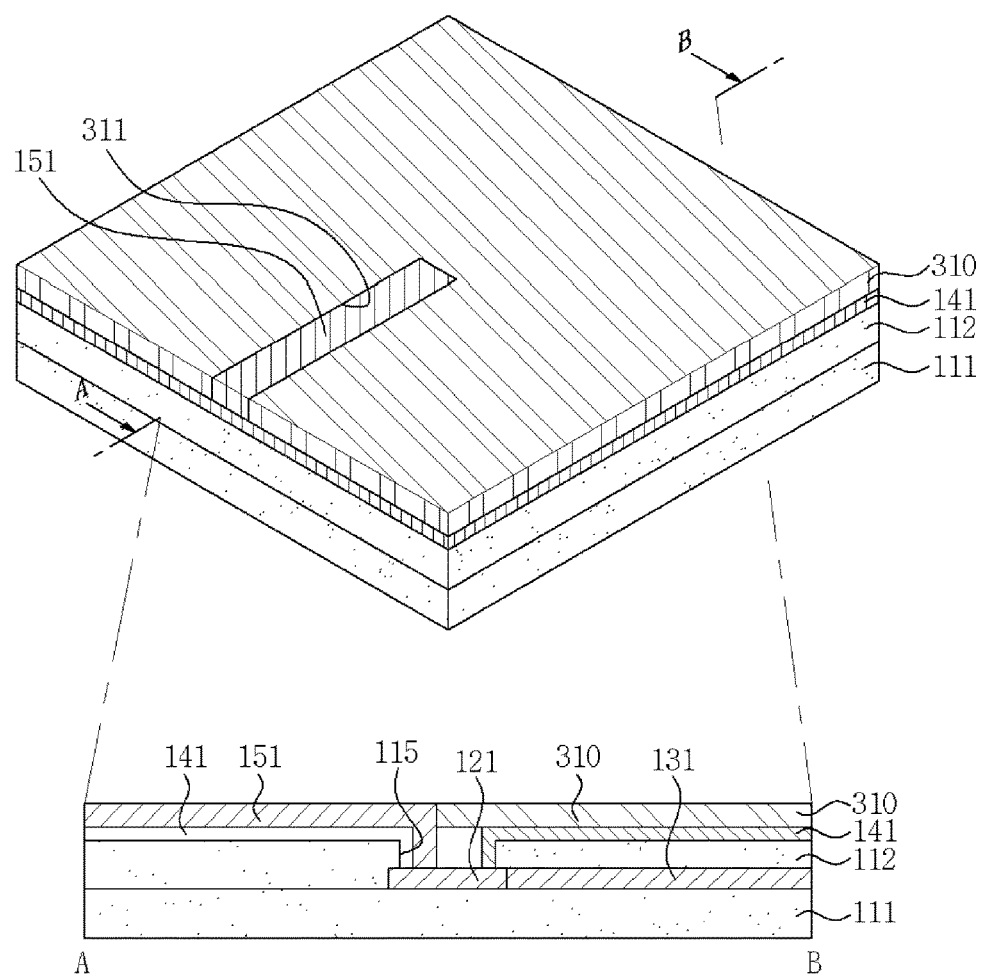

Referring to FIG. 8, an electroplating process is performed.

According to the exemplary embodiment of the present disclosure, an electroplating process is performed on the opening part 311 of the plating resist 310. After the electroplating process is performed, a plating layer 151 is formed on the portion of the via hole 115 exposed by the opening part 311 and the seed layer 141. Here, the via hole 115 and the plating layer 151 formed on the seed layer 141 are formed in a structure in which they are continuous to each other.

According to the exemplary embodiment of the present disclosure, the plating layer 151 is made of a conductive material used in a circuit board field. For example, the plating layer 151 is made of copper.

Figure 9:
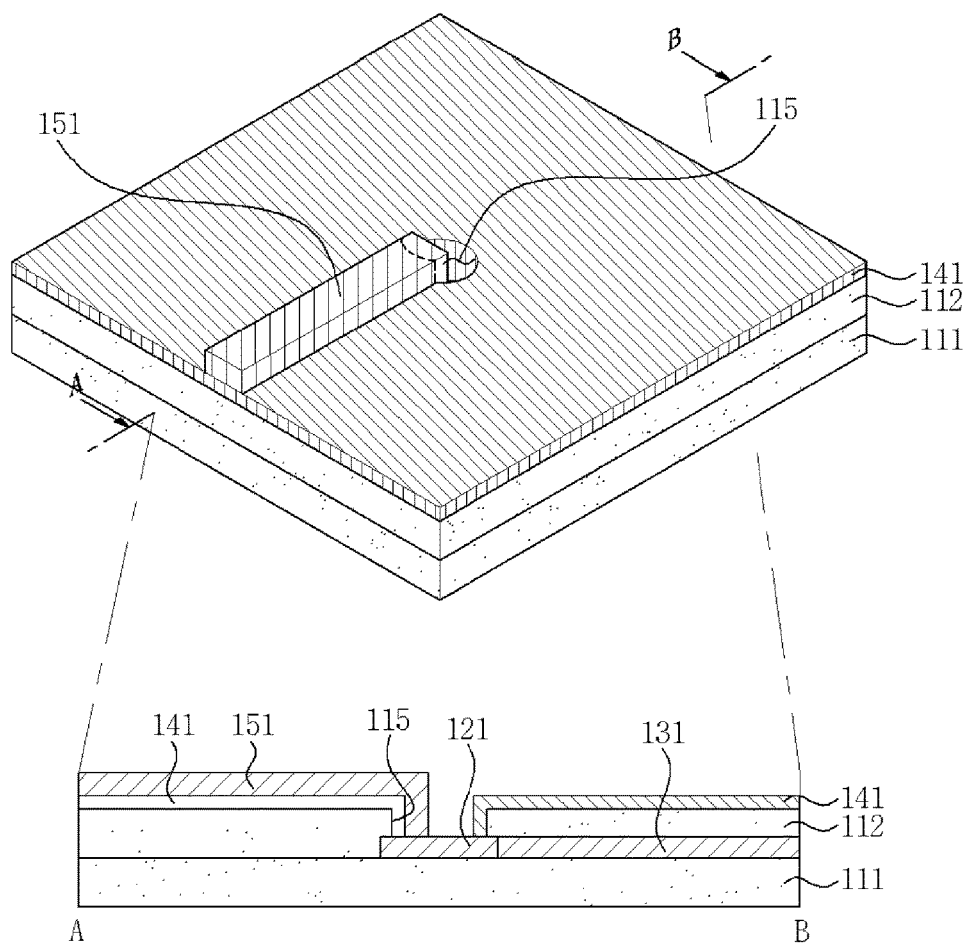

Referring to FIG. 9, the plaiting resist (310 in FIG. 8) is removed.

Figure 10:
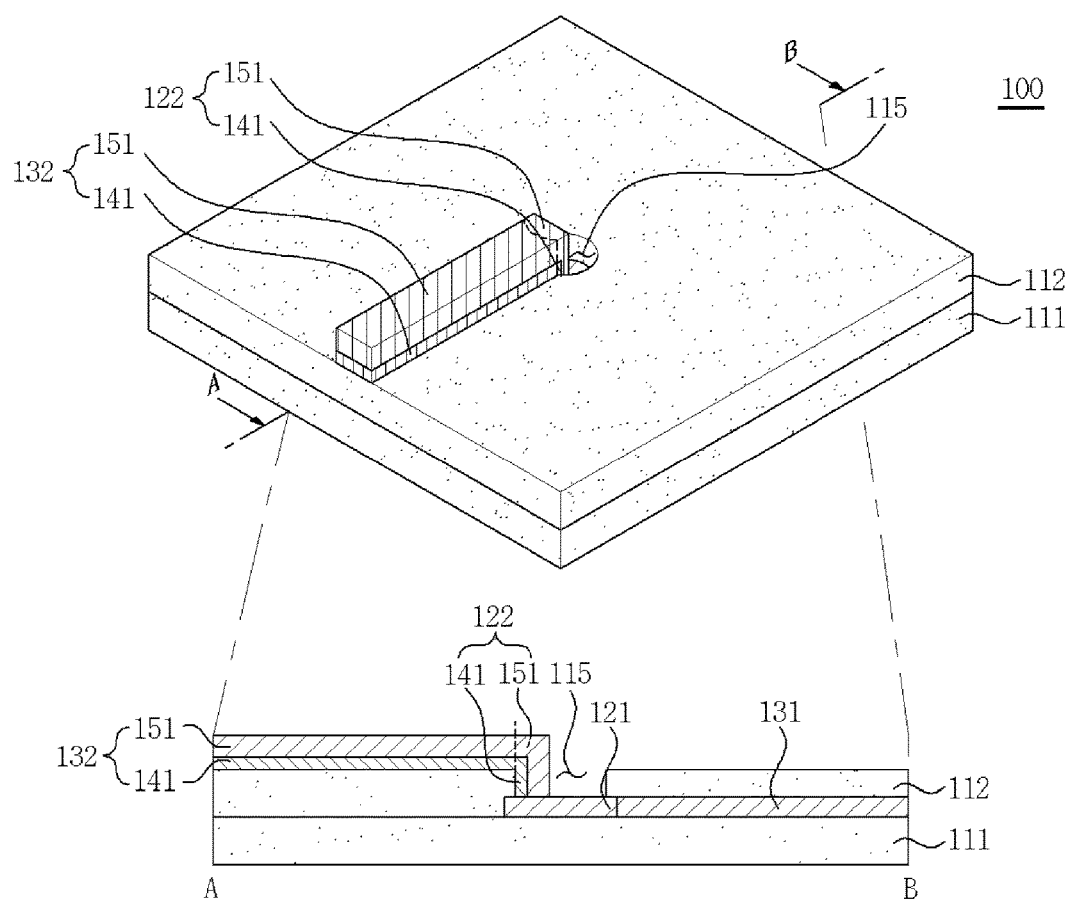

Referring to FIG. 10, the via 122 and the second circuit patterns 132 are formed.

According to the exemplary embodiment of the present disclosure, the seed layer 141 exposed to the outside by removing the plating resist (310 in FIG. 8) is removed. According to the exemplary embodiment of the present disclosure, the seed layer 141 is removed by any method of removing the seed layer known in a circuit board field.

As described above, the seed layer 141 exposed to the outside is removed to form the via 122 and the second circuit patterns 132. According to the exemplary embodiment of the present disclosure, the via 122 includes the seed layer 141 and the plating layer 151 formed in the via hole 115. In addition, the second circuit patterns 132 include the seed layer 141 and the plating layer 151 formed above the via hole 115 and the second insulation layer 112. Therefore, the via 122 and the second circuit patterns 132 are formed in a structure in which they are continuous while being bonded to each other.

According to the exemplary embodiment of the present disclosure, since the via 122 is formed in a portion of the via hole 115, the via 122 has a diameter smaller than that of the via hole 115. In addition, the second circuit patterns 132 have a diameter smaller than that of the via hole 115. Therefore, the plurality of vias 122 and the second circuit patterns 132 may have high density.

Figure 11:
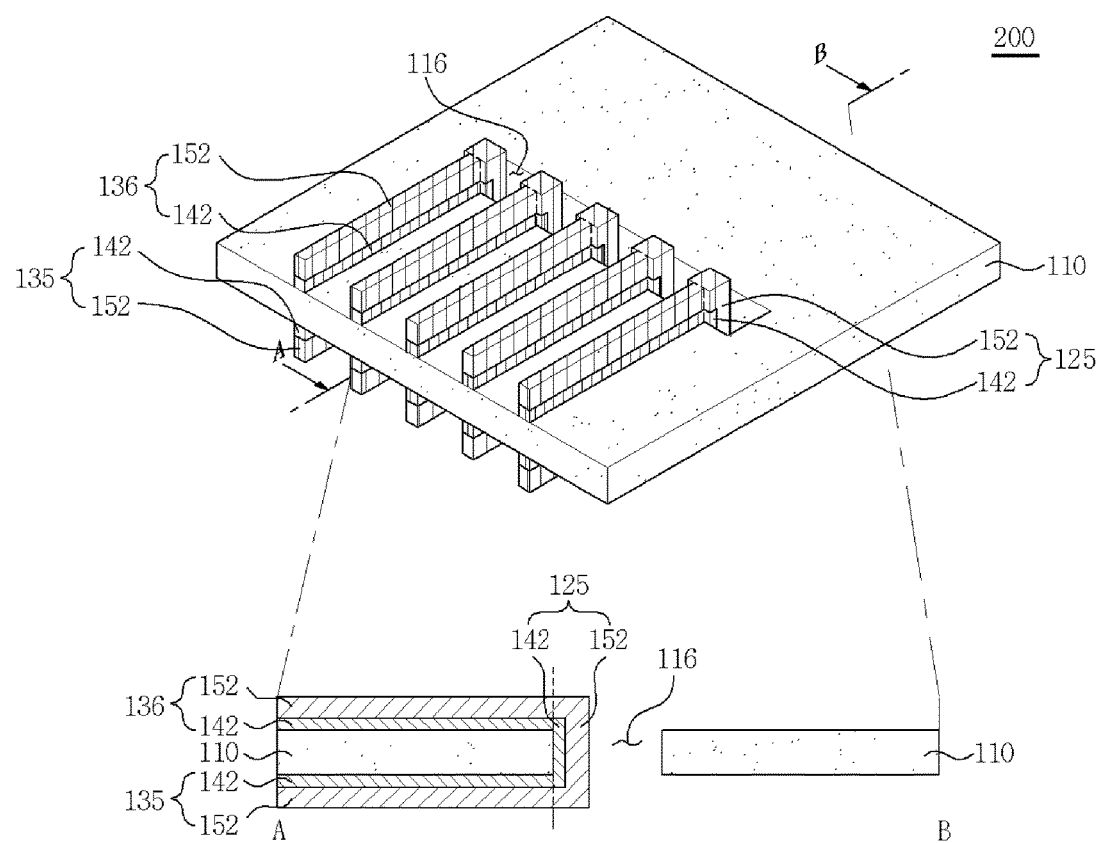
FIG. 11 is an exemplified view illustrating a printed circuit board according to a second exemplary embodiment of the present disclosure.

FIG. 11 is an exemplified view illustrating a printed circuit board according to the second exemplary embodiment of the present disclosure.

Referring to FIG. 11, the printed circuit board 200 according to the second exemplary embodiment of the present disclosure includes the insulation layer 110, the via land 121, vias 125, the first circuit patterns 135 and the second circuit patterns 136.

According to the exemplary embodiment of the present disclosure, the insulation layer 110 is made of a complex polymer resin which is generally used as an interlayer insulation material. For example, the insulating layer 110 may be made of a prepreg, or an epoxy based resin such as Ajinomoto Build up Film (ABF), FR-4, Bismaleimide Triazine (BT) or the like. In addition, although not shown in FIG. 11, a build up layer including one or more layers of insulation layers and circuit patterns may be further formed below the insulation layer 110.

According to the exemplary embodiment of the present disclosure, the via hole 116 is formed in the insulation layer 110. According to the exemplary embodiment of the present disclosure, the via hole 116 is formed so as to penetrate through the insulation layer 110. Although the via hole 116 is formed in a quadrangle in FIG. 11, a structure of the via hole 116 is not limited thereto.

According to the exemplary embodiment of the present disclosure, the plurality of first circuit patterns 135 are formed below the insulation layer 110. According to the exemplary embodiment of the present disclosure, the first circuit patterns 135 are made of a conductive metal used in a circuit board field. For example, the first circuit patterns 135 are made of copper.

According to the exemplary embodiment of the present disclosure, the plurality of second circuit patterns 136 are formed on the insulation layer 110. According to the exemplary embodiment of the present disclosure, the second circuit patterns 136 are made of a conductive metal used in a circuit board field. For example, the second circuit patterns 136 are made of copper.

According to the exemplary embodiment of the present disclosure, the via 125 is formed in the via hole 116 of the second insulation layer 112 so as to penetrate through the second insulation layer 112. In addition, the vias 125 are formed in plural. Here, the printed circuit board 200 according to the exemplary embodiment of the present disclosure has a structure in which the plurality of vias 125 are formed in one via hole 116. In addition, one side surface of the via 125 positioned in the via hole 116 contacts the insulation layer 110 and the other side surface thereof does not contact the insulation layer 110.

According to the exemplary embodiment of the present disclosure, the via 125 is made of a conductive material used in a circuit board field. For example, the via 125 is made of copper.

According to the exemplary embodiment of the present disclosure, a lower side surface of the via 125 is bonded to the first circuit patterns 135. In addition, an upper side surface of the via 125 is bonded to the second circuit patterns 136. That is, the first circuit patterns 135 and the second circuit patterns 136 which are formed on different layers are electrically connected to each other by the via 125.

According to the exemplary embodiment of the present disclosure, the first circuit patterns 135, the second circuit patterns 136, and the vias 125 have a diameter smaller than that of the via hole 116. In particular, sum of diameters of the plurality of vias 125 formed in the via hole 116 is smaller than a diameter of the via hole 116. Therefore, even though the plurality of vias 125 are formed in the via hole 116, the vias 125 may be insulated from each other without contact. In addition, sum of diameters of the plurality of first circuit patterns 135 is smaller than a diameter of the via hole 116. In addition, sum of diameters of the plurality of second circuit patterns 136 is smaller than a diameter of the via hole 116. Therefore, even through the first circuit patterns 135 and the second circuit patterns 136 are bonded to the plurality of vias 125, respectively, insulation with neighboring patterns may be maintained.

In addition, according to the exemplary embodiment of the present disclosure, the second circuit patterns 136 have a diameter different from the via 125. As shown in FIG. 11, the second circuit patterns 136 have a diameter smaller than that of the via 125 and the first circuit patterns 135.

In the printed circuit board 200 according to the exemplary embodiment of the present disclosure, the plurality of vias 125, the first circuit patterns 135 and the second circuit patterns 136 have a diameter smaller than that of the via hole 116. Therefore, even in a case in which there are a plurality of first circuit patterns 135, a plurality of second circuit patterns 136, and a plurality of vias 125 in the printed circuit board 200 according to the exemplary embodiment of the present disclosure, the first circuit patterns 135, the second circuit patterns 136, and the vias 125 may have high density.

Although not shown in the exemplary embodiment of the present disclosure, one or more layers of insulation layers and circuit layers may be further formed above or below the insulation layer 110.

FIGS. 12 through 18 are exemplified views illustrating a method of manufacturing a printed circuit board according to the second exemplary embodiment of the present disclosure.

Figure 12:
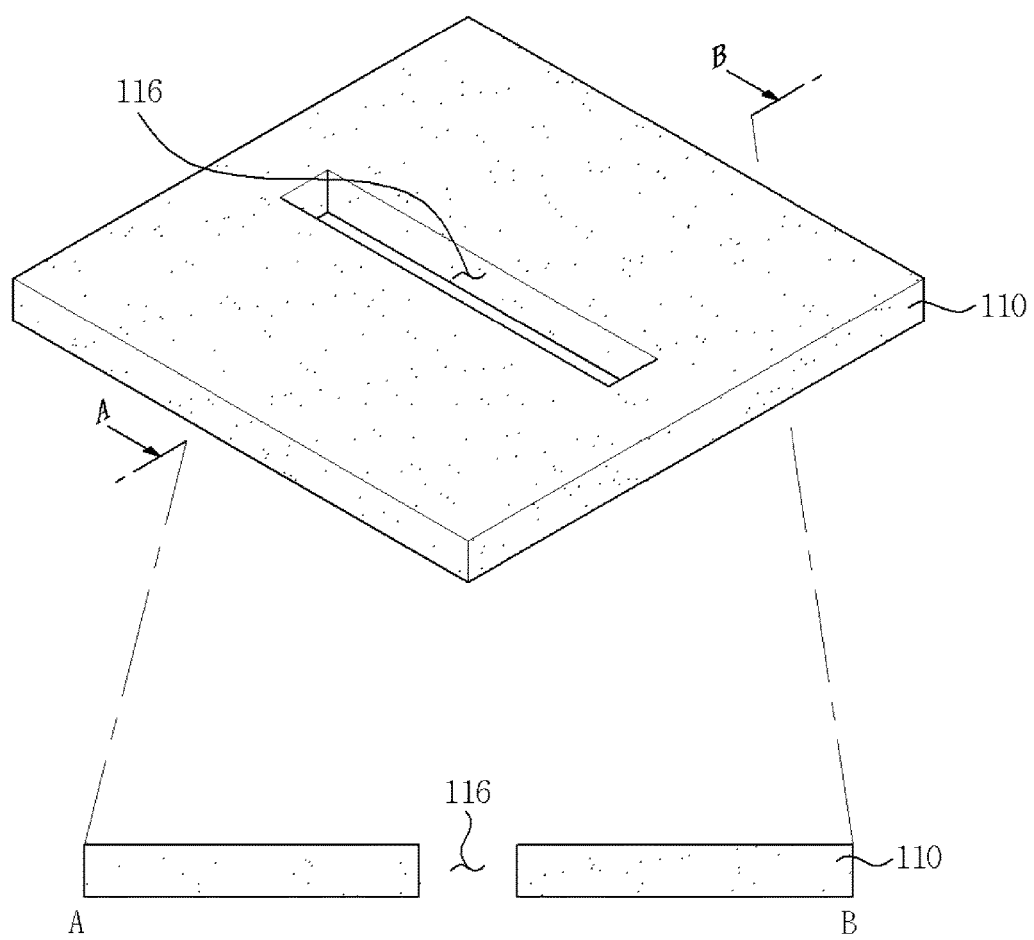
FIGS. 12 through 18 are exemplified views illustrating a method of manufacturing a printed circuit board according to the second exemplary embodiment of the present disclosure.

Referring to FIG. 12, the via hole 116 is formed in the insulation layer 110.

According to the exemplary embodiment of the present disclosure, the insulation layer 110 is made of a complex polymer resin which is generally used as an interlayer insulation material. For example, the insulation layer 110 is made of a prepreg, or an epoxy based resin such as Ajinomoto Build up Film (ABF), FR-4, Bismaleimide Triazine (BT) or the like.

In the exemplary embodiment of the present disclosure, although the via hole 116 is formed in the insulation layer 110 by way of example, the present disclosure is not limited thereto. For example, the via hole 116 may be formed on a copper clad laminate (CCL) in which metal layers are stacked on both surfaces of the insulation layer 110.

According to the exemplary embodiment of the present disclosure, the via hole 116 may be formed by using a drill bit or a punch machine. However, a method of forming the via hole 116 is not limited thereto. The via hole 116 may be formed by any known method of forming the via hole in a circuit board field.

Figure 13:
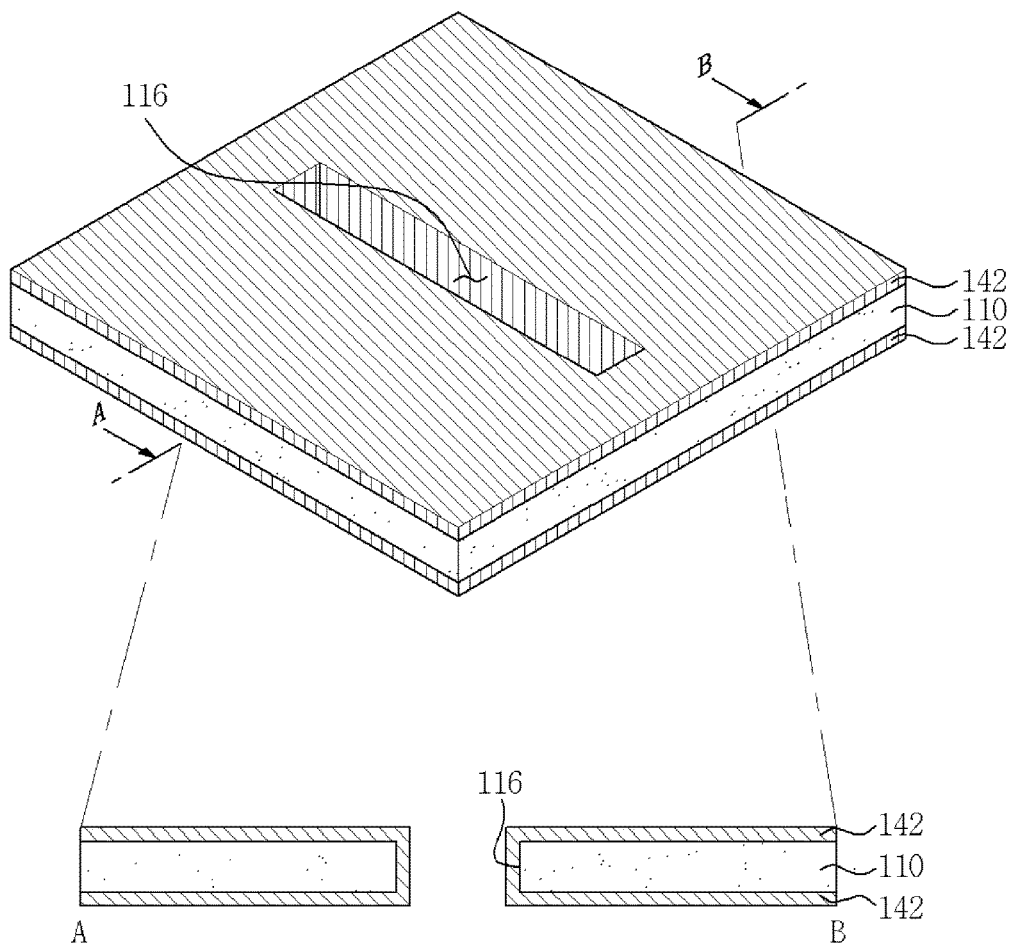

Referring to FIG. 13, the seed layer 142 is formed.

According to the exemplary embodiment of the present disclosure, the seed layer 142 is formed on and beneath the insulation layer 110. In addition, the seed layer 142 is formed on an inner side surface of the via hole 116.

According to the exemplary embodiment of the present disclosure, the seed layer 142 is formed by an electroless plating method. The seed layer 142 according to the exemplary embodiment of the present disclosure is made of a conductive material used in a circuit board field. For example, the seed layer 142 is made of copper.

Figure 14:
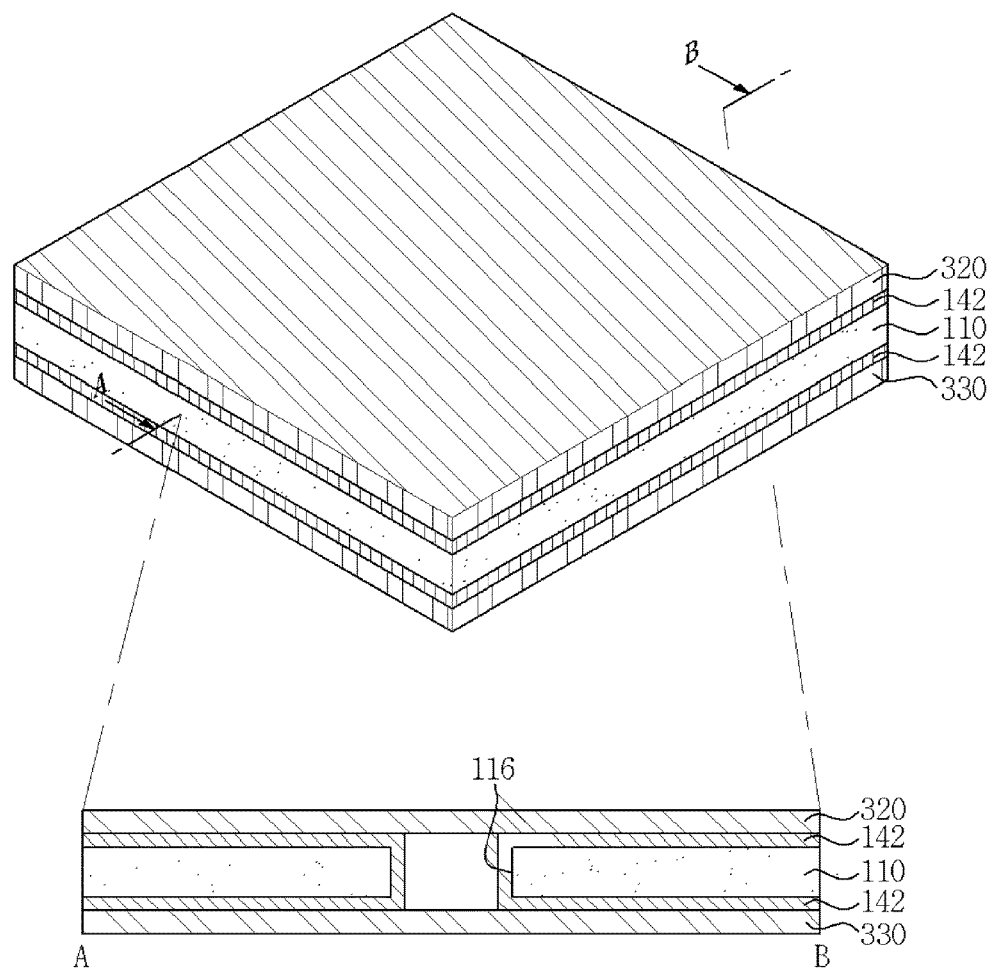

Referring to FIG. 14, a first plating resist 320 and a second plating resist 330 are formed.

According to the exemplary embodiment of the present disclosure, the first plating resist 320 is formed on the seed layer 142 formed below the insulation layer 110. In addition, the second plating resist 330 is formed on the seed layer 142 on the insulation layer 110. Here, an upper portion of the seed layer 142 is positioned in an opposite direction of a surface on which the seed layer 142 contacts the insulation layer 110.

The plating resist 310 according to the exemplary embodiment of the present disclosure is made of a photosensitive material.

Figure 15:
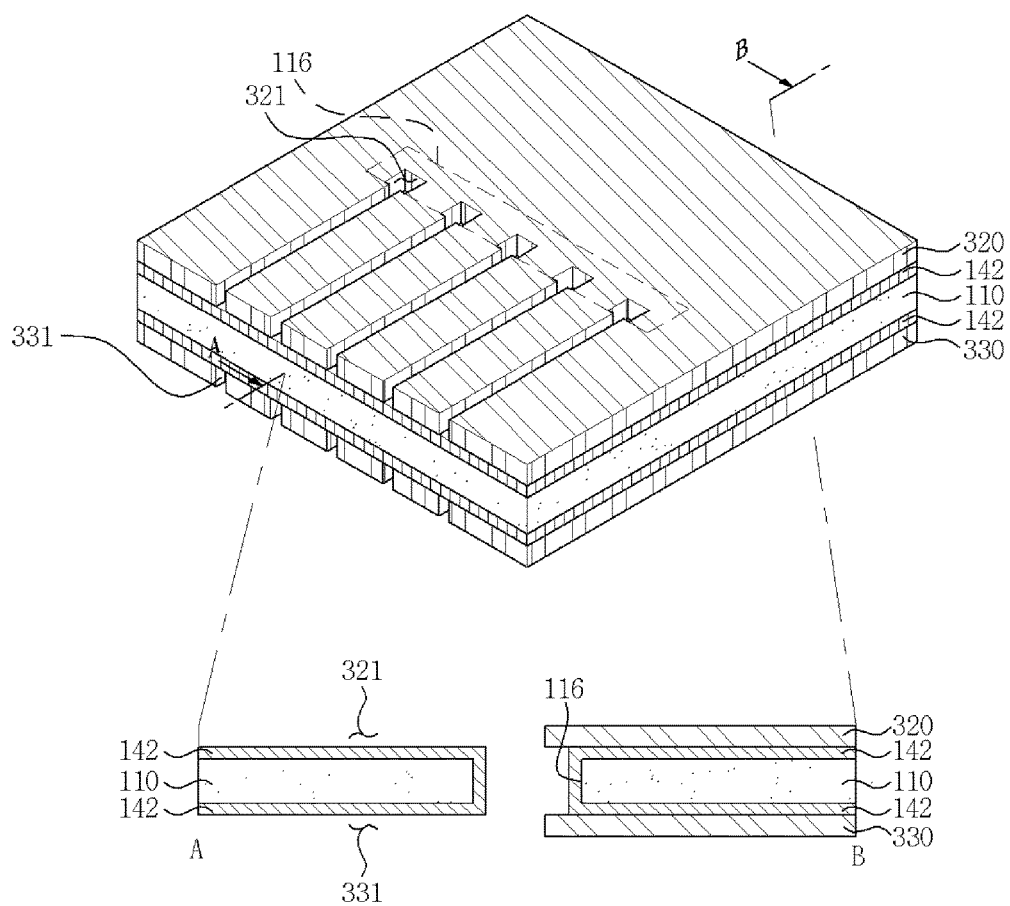

Referring to FIG. 15, patterning is performed on the first plating resist 320 and the second plating resist 330.

According to the exemplary embodiment of the present disclosure, exposure and development processes are performed on the first plating resist 320 and the second plating resist 330 to form a plurality of first opening parts 321 and second opening parts 331.

According to the exemplary embodiment of the present disclosure, the first opening parts 321 are formed in the first plating resist 320. The first opening parts 321 are formed so as to expose regions in which the first circuit patterns (not shown) and the vias (not shown) are to be formed later to the outside. Therefore, the first opening parts 321 of the first plating resist 320 are formed so as to expose a portion of the via hole 116 and a portion of the seed layer 142 formed below the insulation layer 110. Here, the first opening parts 321 are formed so that the portion of the via hole 116 and the portion of the seed layer 142 are continuously exposed. In addition, one end of the plurality of first opening parts 321 is positioned below the via hole 116. Here, sum of diameters of the plurality of first opening parts 321 is smaller than a diameter of the via hole 116.

According to the exemplary embodiment of the present disclosure, the second opening parts 331 are formed in the second plating resist 330. The second opening parts 331 are formed so as to expose regions in which the second circuit patterns (not shown) and the vias (not shown) are to be formed later to the outside. Therefore, the second opening parts 331 of the second plating resist 330 are formed so as to expose a portion of the via hole 116 and a portion of the seed layer 142 formed on the insulation layer 110. Here, the second opening parts 331 are formed so that the portion of the via hole 116 and the portion of the seed layer 142 are continuously exposed. In addition, one end of the plurality of second opening parts 331 is positioned below the via hole 116. Here, sum of diameters of the plurality of second opening parts 331 is smaller than a diameter of the via hole 116.

Figure 16:
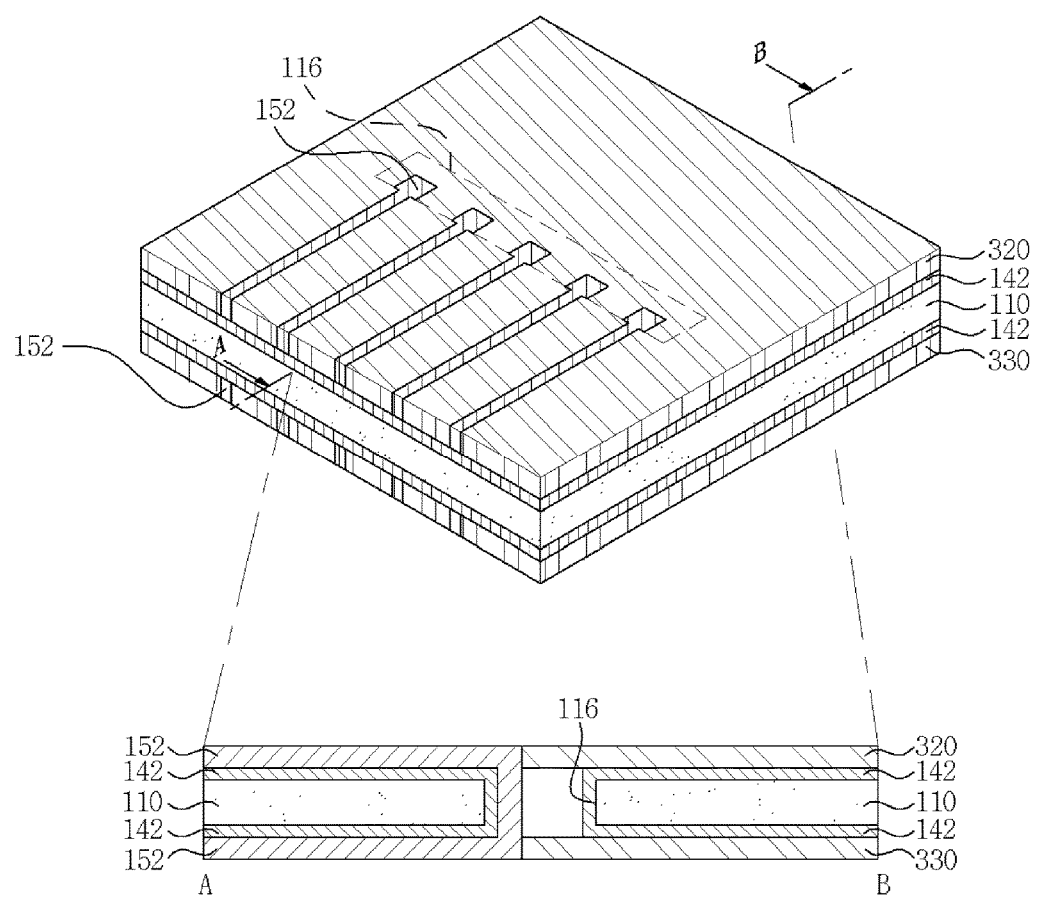

Referring to FIG. 16, an electroplating process is performed.

According to the exemplary embodiment of the present disclosure, the electroplating process is performed on the first opening part 321 of the first plating resist 320 and the second opening part 331 of the second plating resist 330. After the electroplating process is performed, the plating layer 152 is formed on the seed layer 142 exposed to the outside by the first opening part 321 and the second opening part 331.

According to the exemplary embodiment of the present disclosure, the plating layer 152 is made of a conductive material used in a circuit board field. For example, the plating layer 152 is made of copper.

Figure 17:
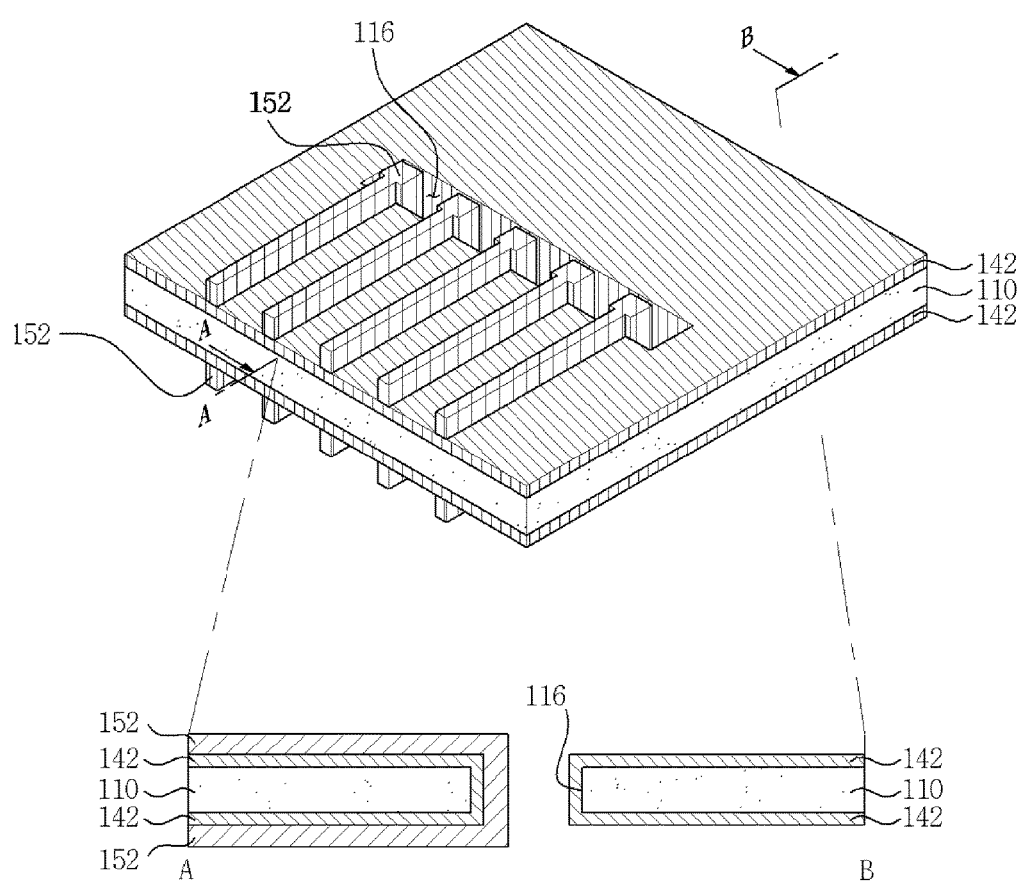

Referring to FIG. 17, the first plating resist (320 of FIG. 16) and the second plating resist (330 of FIG. 16) are removed.

Figure 18:
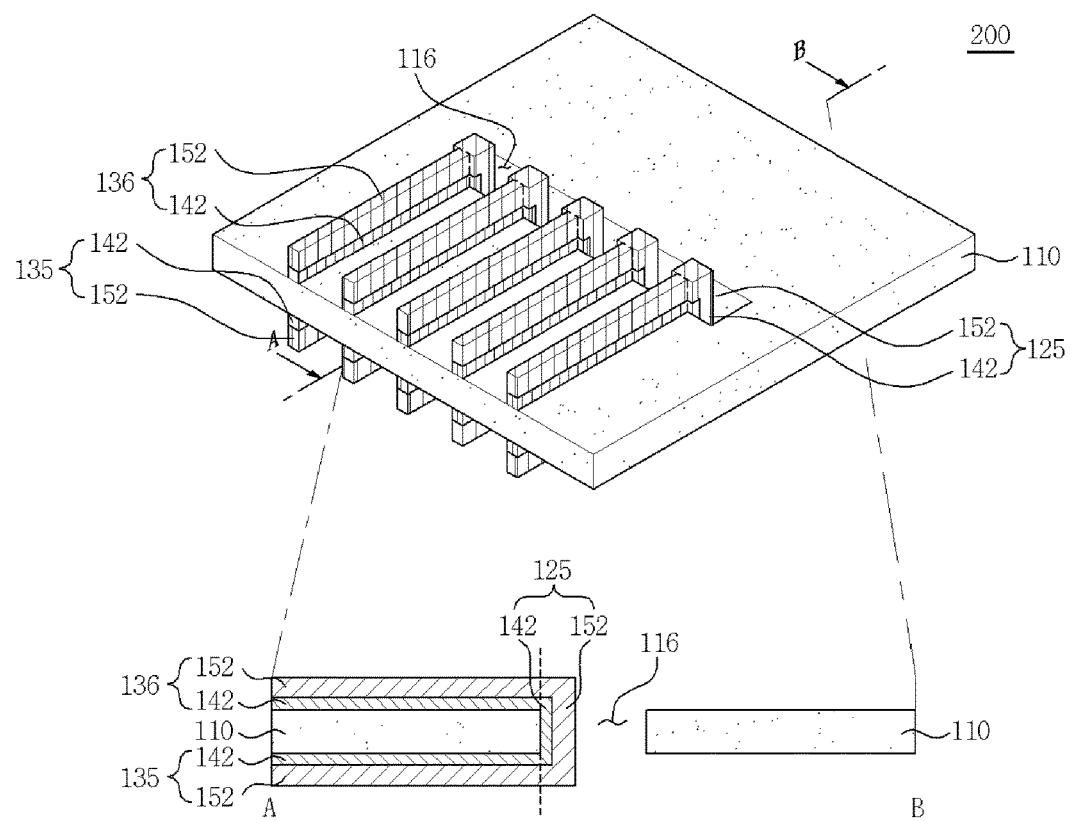

Referring to FIG. 18, the via 125, the first circuit patterns 135, and the second circuit patterns 136 are formed.

According to the exemplary embodiment of the present disclosure, first, the seed layer 142 exposed to the outside by the removed first plating resist and the second plating resist (FIG. 14) is removed. According to the exemplary embodiment of the present disclosure, the seed layer 142 is removed by any known method of removing the seed layer in a circuit board field.

As described above, when the seed layer 142 exposed to the outside is removed, the plurality of first circuit patterns 135 including the seed layer 142 and the plating layer 152 are formed below the insulation layer 110. In addition, the plurality of second circuit patterns 136 including the seed layer 142 and the plating layer 152 are formed on the insulation layer 110. Further, the plurality of vias 125 including the seed layer 142 and the plating layer 152 are also formed in the via hole 116. The plurality of first circuit patterns 135 and the second circuit patterns 136 are electrically connected to each other by the via 125 as formed above.

In the printed circuit board 200 formed by the above-described method, the plurality of vias 125, the first circuit patterns 135 and the second circuit patterns 136 have a diameter smaller than that of the via hole 116. Therefore, even in a case in which the first circuit patterns 135, the second circuit patterns 136, and the vias 125 are formed in plural, it is possible to have high density.

Although not shown in the exemplary embodiment of the present disclosure, one or more layers of insulation layers and circuit layers may be further formed above or below the insulation layer 110.

Although the embodiments of the present disclosure have been disclosed for illustrative purposes, it will be appreciated that the present disclosure is not limited thereto, and those skilled in the art will appreciate that various modifications, additions and substitutions are possible, without departing from the scope and spirit of the disclosure.

Accordingly, any and all modifications, variations or equivalent arrangements should be considered to be within the scope of the disclosure, and the detailed scope of the disclosure will be disclosed by the accompanying claims.

What is claimed is:

1. A printed circuit board comprising:
    an insulation layer having a via hole formed therein;
    a plurality of first circuit patterns formed on one surface of the insulation layer;
    a plurality of second circuit patterns formed on the other surface of the insulation layer; and
    a plurality of vias formed in and protruded from the via hole and connecting the plurality of first circuit patterns with the plurality of second circuit patterns, respectively,
    wherein the via hole is formed in an elongated shape, wherein the plurality of first circuit patterns and the plurality of second circuit patterns are extended on one side of the via hole, and wherein the plurality of vias are arranged in parallel by being separated in a lengthwise direction on one side of the via hole.

2. The printed circuit board of claim 1, wherein the plurality of first circuit patterns and the plurality of second circuit patterns are arranged on a same side of the elongated shape of via hole.

3. The printed circuit board of claim 1, wherein the first circuit patterns each have a diameter smaller than that of the via hole.

4. The printed circuit board of claim 1, wherein the second circuit patterns each have a diameter different from that of the via hole.

5. The printed circuit board of claim 1, further comprising a plurality of via lands formed below the insulation layer and bonded, respectively, to lower surfaces of the plurality of vias.

6. The printed circuit board of claim 5, wherein the first circuit patterns are bonded, respectively, to the plurality of via lands.

* * * * *